United States Patent [19]
Whiteman

[11] Patent Number: 6,094,042
[45] Date of Patent: Jul. 25, 2000

[54] PROBE COMPENSATION FOR LOSSES IN A PROBE CABLE

[75] Inventor: Donald A. Whiteman, Colorado Springs, Colo.

[73] Assignee: Agilent Technologies, Palo Alto, Calif.

[21] Appl. No.: 09/016,172

[22] Filed: Jan. 30, 1998

[51] Int. Cl.$^7$ ...................................................... G01R 1/02
[52] U.S. Cl. .......................................... 324/72.5; 324/754
[58] Field of Search ..................................... 324/72.5, 754

[56] References Cited

U.S. PATENT DOCUMENTS

| | | | |
|---|---|---|---|
| 2,883,619 | 4/1959 | Kobbe | 324/72.5 |
| 4,418,314 | 11/1983 | Nieto, Jr. | 324/72.5 |
| 4,719,408 | 1/1988 | Carlton | 324/57 |
| 4,743,839 | 5/1988 | Rush | 324/72.5 |
| 4,978,907 | 12/1990 | Smith | 324/72.5 |
| 4,996,497 | 2/1991 | Waehner | 330/151 |
| 5,172,051 | 12/1992 | Zamborelli | 324/72.5 |
| 5,218,293 | 6/1993 | Kan . | |
| 5,691,635 | 11/1997 | Pot | 324/115 |

FOREIGN PATENT DOCUMENTS

| | | |
|---|---|---|
| 0513992A1 | 11/1992 | European Pat. Off. . |
| 0786647A1 | 7/1997 | European Pat. Off. . |

OTHER PUBLICATIONS

"Nanosecond Passive Voltage Probes" by Patrick A. McGovern, published in IEEE Transactions On Instrumentation And Measurement, vol. 1M–26, No. 1, Mar. 1977.

"Probes And Transducers", by John D. Lenk, 1994, chapter 5, published in McGraw Hill Electronic Testing Handbook: Procedures And Techniques, pp. 191–196, ISBN 0–07–037602–6(H).

"Probes And Input Circuits", by T.H. O'Dell, 1991, chapter 5, published in Circuits For Electronic Instrumentation, pp. 72–89, published by Cambridge University Press ISBN 0–521–40428–2.

HP Catalog—1983—10020A Rensistive Dividers.

*Primary Examiner*—Ernest Karlsen
*Assistant Examiner*—Jose M. Solis

[57] ABSTRACT

A probe tip for connecting an instrument to a circuit under test is disclosed. The probe tip is interchangeable with other probe tips to provide different attenuations of the signal under test to the instrument. The signal from the circuit under test is coupled to the instrument via a cable. The probe tips have a compensation network that cancels the effects of cable loss. The probe tips provide attenuation by using the probe tips internal impedance, and the characteristic impedance of the cable, to form a voltage divider.

10 Claims, 1 Drawing Sheet

PROBE COMPENSATION FOR LOSSES IN A PROBE CABLE

FIELD OF THE INVENTION

This invention relates generally to electronic instruments. More particularly, this invention relates to oscilloscopes and other instruments for analyzing high-speed signals. Even more particularly, this invention relates to probe tips for connecting high-speed/high-frequency signals to an electronic instrument.

BACKGROUND OF THE INVENTION

An electronic instrument needs to be connected to whatever circuit, device, or system that is being tested. This is typically accomplished by a probe that is connected, by the user, to the circuit under test. This probe establishes an electrical connection with the circuit node under test, and passes the signal present at that node down a cable to the instrument.

Unfortunately, the non-ideal properties of real world cables can cause the signal to be degraded as it passes down the cable from the probe to the instrument. This signal loss increases with frequency. The loss of these high-frequency components causes signals, such as square-waves, to appear inaccurately when displayed on an oscilloscope. In particular, a square-wave will appear to have a rounded leading edge when displayed on an oscilloscope.

Accordingly, there is a need in the art for an apparatus and method that compensates for the loss of high-frequency signal components due to the non-ideal properties of real world cables. It is desirable that the solution minimize the size of the probe tip, both for the convenience of the user, and to minimize the capacitive loading of the probe on the circuit under test. Furthermore, many users find it desirable to be able to change the attenuation of the signal entering the instrument as well as the probe impedance. The solution should accommodate that desire.

SUMMARY OF THE INVENTION

This invention compensates for cable loss with a network tuned to eliminate cable losses that is placed in an interchangeable probe tip. This compensation network may be fabricated solely from passive components to minimize the size of the probe tip. Placing the compensation network in an interchangeable probe tip allows different tips to be used in order to provide different signal attenuations and probe impedances. In the preferred embodiment, the compensation network is a parallel resistor and capacitor in series with a resistive element. This forms a resistive divider that provides the desired attenuation while compensating for cable losses. These elements may be constructed of thick-film, laser-trimmed components that are placed in the probe tip housing. This allows them to be interchanged with other component values by changing the probe tip housing. Interchangeable probe tips allow different attenuations, input impedances, and compensation characteristics to be selected by the user.

DESCRIPTION OF THE PREFERRED EMBODIMENTS

Figure 1:
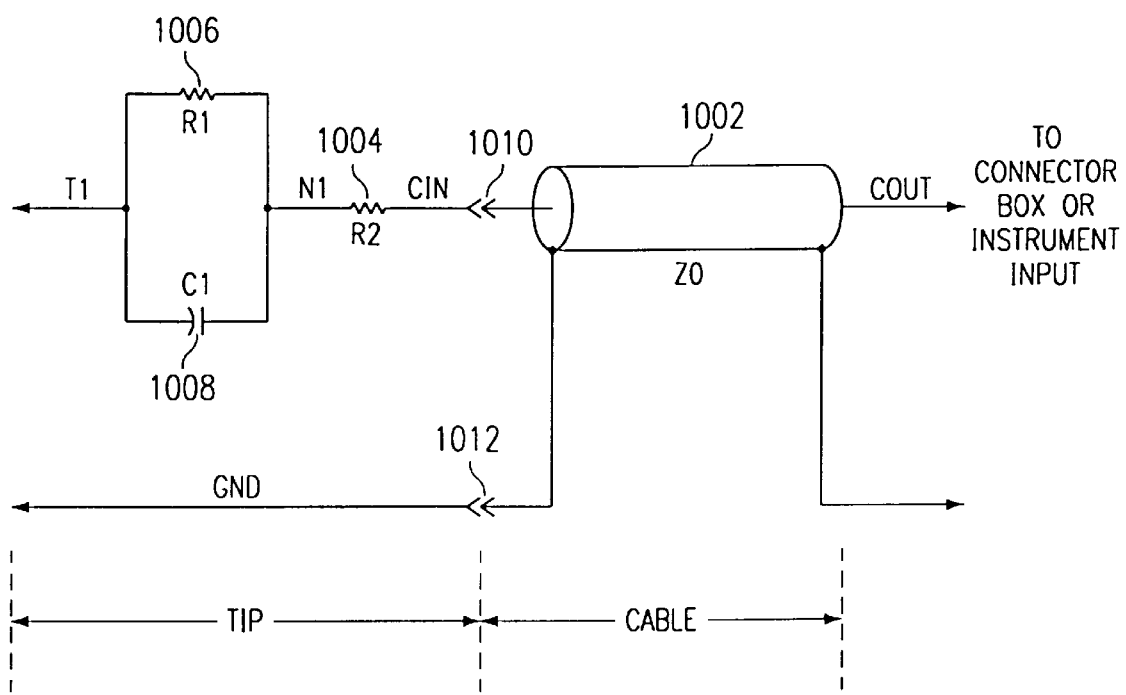
FIG. 1 illustrates a schematic of a first order RC network in an interchangeable resistor divider probe tip being used to compensate for cable loss.

FIG. 1 illustrates a schematic of a first order RC network in an interchangeable resistor divider probe tip being used to compensate for cable loss. Node T1, at the end of the probe tip, is used to connect to the circuit node under test. Node GND is used to establish a common ground between the circuit under test, and the instrument. Node T1 connects to the parallel combination of resistor R1 1006 and C1 1008. The other end of the parallel combination of resistor R1 1006 and C1 1008 is connected to node N1. R2 1004 is connected between nodes N1 and CIN. Node CIN is the input to cable 1002. The other end of cable 1002 is node COUT. Node COUT connects to a connector box that eventually couples the signal to the instrument, or alternatively, COUT connects directly to the instrument input. Cable 1002 has characteristic impedance Z0. The ground node, GND is connected to the connector box or the instrument through the sheath of cable 1002. The probe tip is comprised of nodes T1, GND, N1, CIN and components R1 1006, C1 1008, and R2 1004 all enclosed in some type of housing. Connectors 1010 and 1012 on nodes CIN and GND, respectively, allow the probe tip to be separated from cable 1002. In this manner, probe tips with different component values for R1 1006, C1 1008, and R2 1004 may be interchanged to provide different input characteristics.

In the preferred embodiment, cable 1002 has a characteristic impedance of Z0=50Ω. To construct a probe tip that provides 10:1 attenuation for AC signals above a certain frequency, and compensates for the losses in cable 1002, the values for R1, R2, and C1 are 60 Ω, 390 Ω, and 70 pF, respectively. R1 and R2 form 450 Ω of resistance at frequencies where the effects of C1, and cable loss, are insignificant. At these frequencies, the impedances of R1 and R2 and the characteristic impedance, Z0, of the terminated cable 1002 form a voltage divider. Because the characteristic impedance of Z0 is 50 Ω, and the cable is terminated to 50 Ω, and because the sum of the impedances of R1 and R2 is 450 Ω, only 10% of the signal at node T1 is coupled onto cable 1002. This is equivalent to 10:1 attenuation. At frequencies where the effects of C1 become significant, C1 serves to "short out" R1 causing the total impedance provided by the combination of R1, R2, and C1 to be less than 450 Ω. This allows more of the signal at these frequencies to be coupled onto cable 1002. R1, R2, and C1, however, were chosen such that the additional signal at these frequencies counteracts the effects caused by the fact that less of the signal at these frequencies actually makes it through cable 1002 to COUT.

The values chosen for R1, R2, and C1 depend on the desired attenuation, the characteristic impedance of cable 1002, and the non-ideal properties of cable 1002. For example, if the non-ideal properties of cable 1002 became significant at lower frequencies, the value of C1 would need to be increased.

It is to be understood that the claimed invention is not to be limited by the preferred embodiments, but encompasses other modifications and alterations within the scope and spirit of the inventive concept. For example, the first order RC network used to compensate for cable losses in the tip may be replaced by more complicated networks that more accurately compensate for the non-first order frequency dependant cable loss characteristics.

I claim:

1. A method of compensating for cable loss during test of a circuit, said method comprising the steps of:

providing a first probe tip having a first compensation network, said first probe tip being configured to connect to a circuit under test and to couple to a connector for non-permanent connection to a cable, wherein said cable has a first frequency dependent cable attenuation corresponding to a first test signal, and wherein said first compensation network has a first frequency dependent compensation network attenuation corresponding to the first test signal, said first frequency dependent compensation network attenuation being configured to alter effects of said first frequency dependent cable attenuation to provide a first frequency independent attenuation of the first test signal; and providing a second probe tip having a second compensation network, said second probe tip being configured to connect to a circuit under test and to couple to said connector for non-permanent connection to said cable, wherein said cable has a second frequency dependent cable attenuation corresponding to a second test signal, and wherein said second compensation network has a second frequency dependent compensation network attenuation corresponding to the second test signal, said second frequency dependent compensation network attenuation being configured to alter effects of said second frequency dependent cable attenuation to provide a second frequency independent attenuation of the second test signal, said second frequency independent attenuation being unequal to said first frequency independent attenuation.

2. The method of claim 1, wherein said first frequency dependent compensation network attenuation is configured to cancel effects of said first frequency dependent cable attenuation.

3. The method of claim 1, wherein said first probe tip has a first tip node, said first tip node being configured to connect to the circuit under test.

4. The method of claim 1, wherein said first probe tip has means for canceling effects of said first frequency dependent cable attenuation.

5. An apparatus for compensating for loss in a cable during test of a circuit, the cable having a first frequency dependent cable attenuation corresponding to a first test signal and a second frequency dependent cable attenuation corresponding to a second test signal, said apparatus comprising:

a first probe tip having a first compensation network, said first probe tip being configured to connect to a circuit under test and to couple to a connector for non-permanent connection to a cable, said first compensation network having a first frequency dependent compensation network attenuation corresponding to the first test signal, said first frequency dependent compensation network attenuation being configured to alter effects of the first frequency dependent cable attenuation to provide a first frequency independent attenuation of the first test signal; and a second probe tip having a second compensation network, said second probe tip being configured to connect to a circuit under test and to couple to the connector for non-permanent connection to the cable, said second compensation network having a second frequency dependent compensation network attenuation corresponding to the second test signal, said second frequency dependent compensation network attenuation being configured to alter effects of the second frequency dependent cable attenuation to provide a second frequency independent attenuation of the second test signal, said second frequency independent attenuation being unequal to said first frequency independent attenuation.

6. The apparatus of claim 5, wherein said first frequency dependent compensation network attenuation is configured to cancel effects of the first frequency dependent cable attenuation.

7. The apparatus of claim 5, wherein said first probe tip has a first tip node, said first tip node being configured to connect to the circuit under test.

8. The apparatus of claim 5, wherein said first probe tip has means for canceling effects of the first frequency dependent cable attenuation.

9. A method of compensating for cable loss during test of a circuit, said method comprising the steps of:

providing a first probe tip having a first tip node and a first compensation network;

connecting said first tip node to a circuit under test;

coupling said first tip node to a connector, for non-permanent connection to a cable, wherein said cable has a first frequency dependent cable attenuation, and wherein said first compensation network has a first frequency dependent compensation network attenuation;

delivering a first signal having a first frequency through said cable, said first compensation network, said first tip node and to said circuit under test, said first frequency dependent compensation network attenuation altering effects of said first frequency dependent cable attenuation to provide a first frequency independent attenuation;

decoupling said first tip node from said connector:

providing a second probe tip having a second tip node and a second compensation network, said second compensation network having a second frequency dependent compensation network attenuation;

connecting said second tip node to a circuit under test;

coupling said second tip node to said connector for non-permanent connection to said cable; and delivering a second signal having a second frequency through said cable, said second compensation network, said second tip node and to said circuit under test, said second frequency dependent compensation network attenuation altering effects of said second frequency dependent cable attenuation to provide a second frequency independent attenuation, said second frequency independent attenuation being unequal to said first frequency independent attenuation.

10. The method of claim 9, wherein the step of decoupling said first tip node from said connector comprises decoupling said first probe tip from said connector.

* * * * *